(12) United States Patent
Cho

(10) Patent No.: US 6,911,287 B2
(45) Date of Patent: Jun. 28, 2005

(54) METHOD AND APPARATUS FOR MEASURING PROCESS ERRORS AND METHOD AND APPARATUS FOR MEASURING OVERLAY USING THE SAME

(75) Inventor: Jeong-Hee Cho, Gyeonggi-do (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 227 days.

(21) Appl. No.: 10/278,801

(22) Filed: Oct. 24, 2002

(65) Prior Publication Data

US 2003/0091914 A1 May 15, 2003

(30) Foreign Application Priority Data

Nov. 13, 2001 (KR) ........................................ 2001-70565

(51) Int. Cl.[7] ................................................ G03F 9/00
(52) U.S. Cl. ............................ 430/22; 430/30; 356/399
(58) Field of Search ...................... 430/22, 30; 356/399

(56) References Cited

U.S. PATENT DOCUMENTS 5,879,843 A * 3/1999 Ueno .......................... 430/22
6,225,012 B1 * 5/2001 Nishi et al. .................. 430/22

FOREIGN PATENT DOCUMENTS

| JP | 55091826 | 7/1980 |
| KR | 1998-21245 | 6/1998 |
| KR | 1020010058692 | 7/2001 |

* cited by examiner

*Primary Examiner*—Christopher G. Young
(74) *Attorney, Agent, or Firm*—Volentine Francos & Whitt

(57) ABSTRACT

In a method and an apparatus for measuring process errors capable of reducing the process errors, and a method and an apparatus for measuring an overlay, at least two regions are assigned on an object to be measured, which has been passed through a predetermined unit process. Process error values of each region are detected. Error correcting values of each region are calculated based on the process error values. The calculated error correcting values are fed back to a device performing the predetermined unit process. The process error values are merged and outputted as one file. The error correcting values of each region formed on the object are reflected in the device performing the unit process, so the process failure generated in each region of the object can be reduced when the unit process is performed.

23 Claims, 16 Drawing Sheets

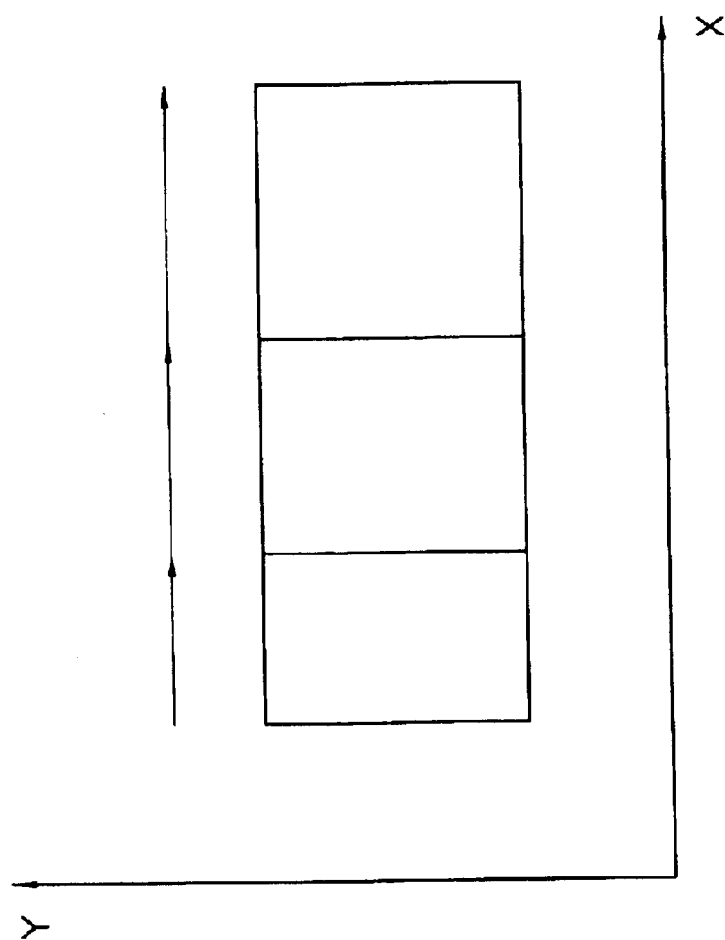

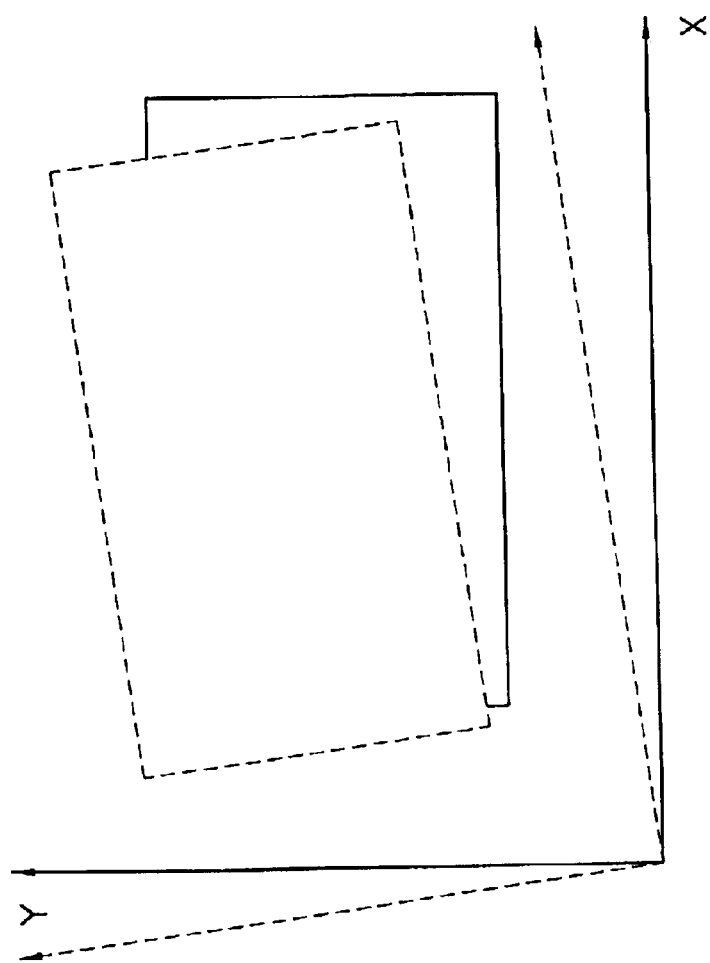

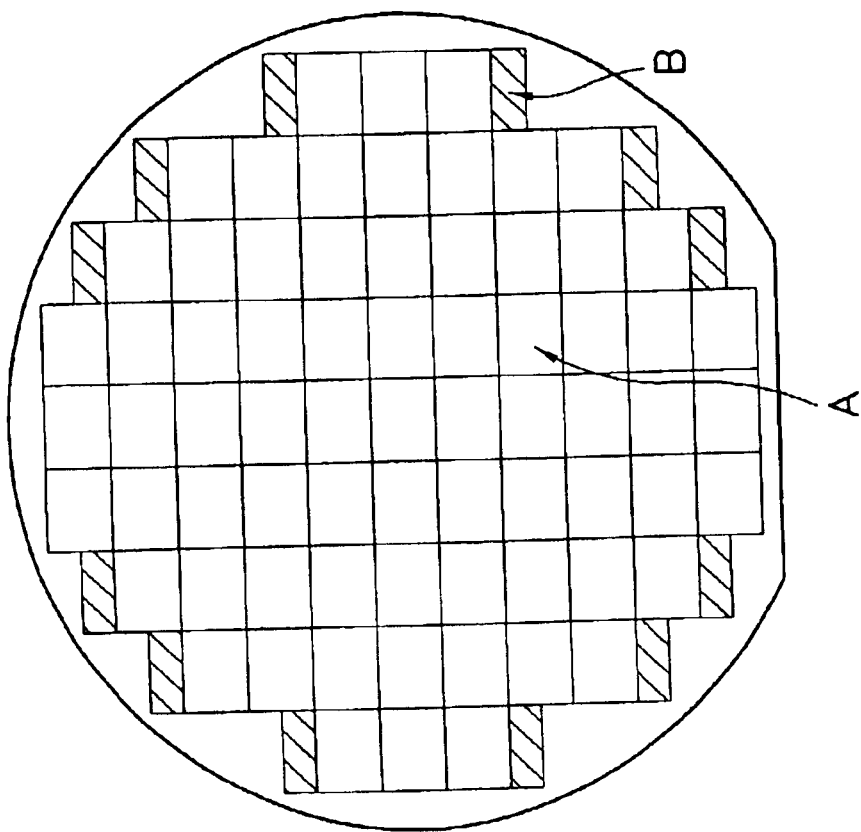

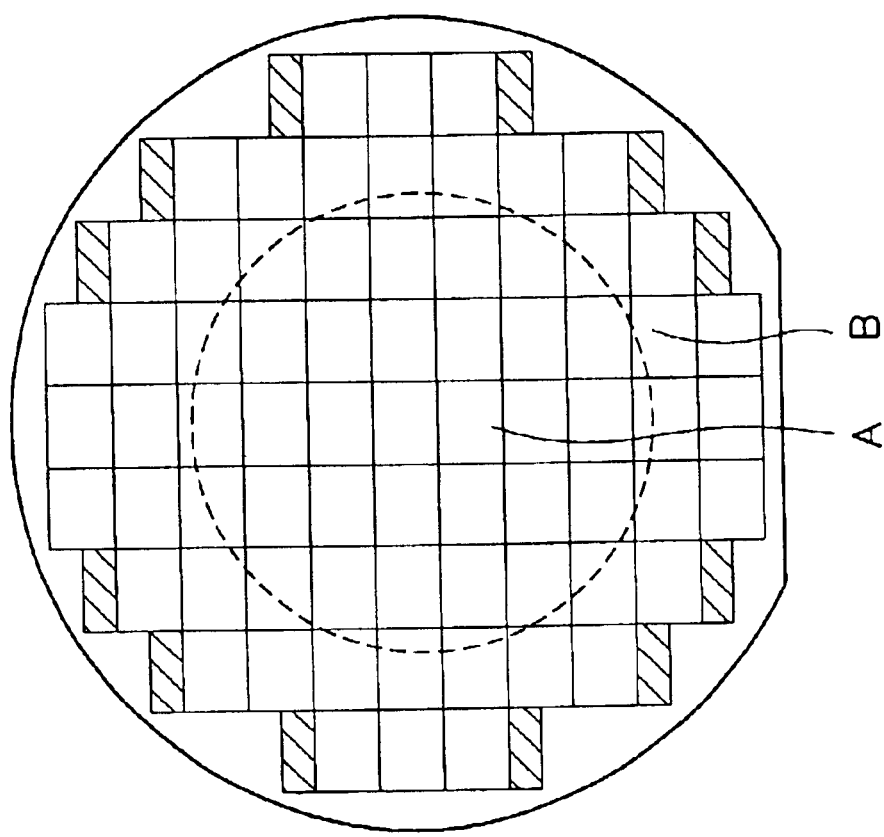

FIG. 8

| REGION A | REGION B | WHOLE WAFER |
|---|---|---|
| WAFER DATA<br>Xsca ........<br>Ysca<br>Xoff<br>Yoff<br>Rot | WAFER DATA<br>Xsca ........<br>Ysca<br>Xoff<br>Yoff<br>Rot | WAFER DATA<br>Xsca ........<br>Ysca<br>Xoff<br>Yoff<br>Rot |
| RETICLE DATA<br>Rot ....<br>Red | RETICLE DATA<br>Rot ....<br>Red | RETICLE DATA<br>Rot ....<br>Red |

FIG. 9
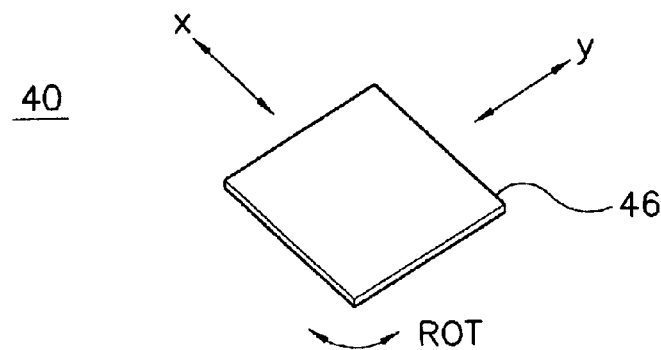
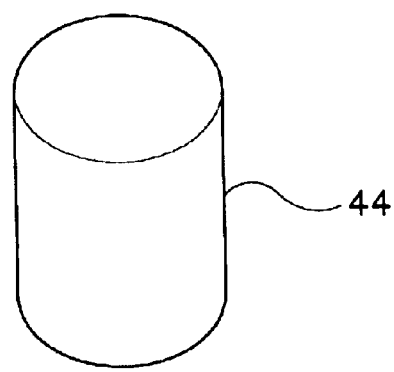
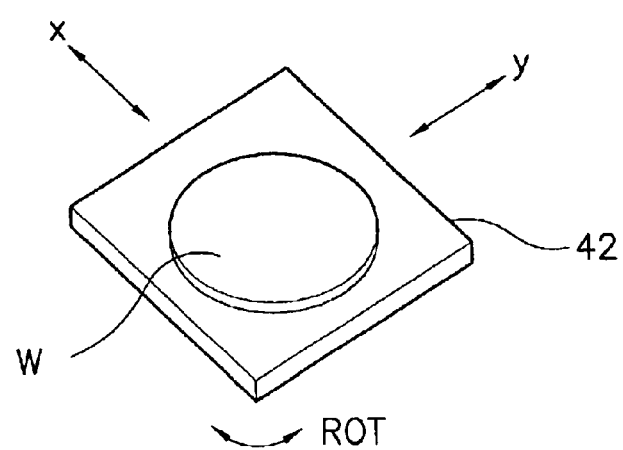

FIG. 11

| REGION A | REGION B | REGION C |
|---|---|---|
| STEP PITCH<br>X: ☐ mm<br>Y: ☐ mm<br>REGION<br>X: ☐<br>Y: ☐<br>... | STEP PITCH<br>X: ☐ mm<br>Y: ☐ mm<br>REGION<br>X: ☐<br>Y: ☐<br>... | STEP PITCH<br>X: ☐ mm<br>Y: ☐ mm<br>REGION<br>X: ☐<br>Y: ☐<br>... |

⋮

METHOD AND APPARATUS FOR
MEASURING PROCESS ERRORS AND
METHOD AND APPARATUS FOR
MEASURING OVERLAY USING THE SAME

CROSS REFERENCES TO RELATED
APPLICATIONS

This application claims priority under 35 U.S.C. §119 from Korean Patent Application No. 2001-0070565, filed on Nov. 13, 2001, the contents of which are hereby incorporated by reference in their entirety as if fully set forth herein.

BACKGROUND

1. Technical Field

The present invention relates to a method and an apparatus for measuring process errors, and more particularly to a method and an apparatus capable of measuring process errors including an overlay of photoresist patterns formed through a photolithography process.

2. Description of the Related Art

In order to improve the competitiveness in a semiconductor industry, unit processes ensuring the high productivity of semiconductor devices have been developed. In addition, methods and apparatuses for measuring process errors in each unit process are variously studied and developed. Particularly, process conditions are frequently varied when performing a photolithography process, which is one of main semiconductor manufacturing processes, so a process for controlling the variation of process conditions and an apparatus for performing the process are required.

One of problems in the photolithography process is a misalignment of a photoresist pattern formed through exposure and development processes. Recently, as semiconductor devices are highly integrated, an alignment margin is reduced and a diameter of a wafer is enlarged, so it is difficult to precisely align the photoresist pattern, so that the misalignment of the photoresist pattern becomes a serious problem. In order to prevent the misalignment of the photoresist pattern, optimizing an overlay measuring process is necessary, which is a process for checking the alignment of the photoresist pattern formed on the wafer.

According to a conventional overlay measuring process, after the formation of the photoresist pattern on the wafer W, an overlay between the photoresist pattern and a pattern layer formed therebelow is measured. At this time, pattern layers are complicatedly formed on each cell of the wafer, so it is difficult to precisely measure the overlay degree thereof. For this reason, alignment marks are added to scribe lines of the wafer W so as to measure the overlay degree. Generally, the overlay measuring process is carried out with respect to 30 to 40% of shots provided in the wafer. In addition, the alignment marks are positioned not at a local area of the wafer but over the whole area of the wafer.

Each overlay degree measured from alignment marks formed on the wafer is analyzed by using a regression analysis method so as to obtain overlay data. The overlay data represent a tilt degree or a rotation degree of the photoresist pattern in the X-axis or Y-axis direction with respect to the wafer and reticle.

After calculating an overlay correcting value by using the overlay data, the overlay correcting value is fed back to an exposure device, thereby preventing the misalignment failure of the wafer to be processed.

However, the conventional overlay measuring method has problems.

Firstly, it is difficult to prevent the misalignment failure in the whole area of the wafer though the overlay correcting value is fed back to the exposure device.

Specifically, even when the exposure process is carried out in the same condition with respect to the wafer, the wafer has an alignment region and a misalignment region thereon. It means that the overlay correcting value is precisely reflected in a predetermined region of the wafer so that misalignment failure is not present, but the overlay correcting value is not precisely reflected in the other region of the wafer so that misalignment failure occurs. The above phenomenon seriously increases as the diameter of the wafer is enlarged.

Secondly, since the overlay can be measured for one shot on each wafer, it is impossible to measure the overlay of abnormal shots (hereinafter, referred to as half-sized shots), which are positioned at an edge of the wafer and have half the size of a normal shot.

As the diameter of the wafer is enlarged, the number of half-sized shots formed at the edge of the wafer increases. However, the process is carried out without checking the overlay of the half-sized shots, so the failure rate of the wafer increases.

SUMMARY

The present invention has been made to solve the above problems of the prior arts, therefore, it is a first object of the present invention to provide a method for measuring process errors so as to reduce the failure rate of the wafer.

A second object of the present invention is to provide an apparatus for measuring the process errors so as to reduce the failure rate of the wafer.

A third object of the present invention is to provide a method for measuring an overlay so as to reduce a misalignment failure.

A fourth object of the present invention is to provide an apparatus for measuring the overlay so as to reduce the misalignment failure.

To achieve the first object of the present invention, there is provided a method for measuring process errors, the method comprising the steps of assigning at least two regions on an object to be measured, which has been passed through a predetermined unit process, detecting process error values from each of the regions, calculating error correcting values of each of the regions based on the process error values and feeding back the calculated error correcting values to a device performing the predetermined unit process.

The process error values detected from each of the regions are merged and outputted as one file.

To achieve the second object of the present invention, there is provided an apparatus for measuring process errors, the apparatus comprising a first section for inputting regions of an object thereinto by assigning at least two regions on the object to be measured, which has been passed through a predetermined unit process, a second section for detecting process error values from each of the regions inputted into the first section, a third section for calculating correcting values of each of the regions based on process error values detected by the second section and a fourth section for feeding back the calculated correcting values to a device performing the predetermined unit process.

According to the method and apparatus for measuring the process errors, the process error values are detected from each region formed on the object to be measured and the error correcting values of each region are calculated, respectively. Therefore, the error correcting values of each region are reflected in the device when the unit process is performed, so the process failure in each region formed on the object can be reduced when the unit process is performed.

To achieve the third object of the present invention, there is provided a method for measuring an overlay, the method comprising the steps of assigning at least two regions on a wafer, which has been passed through an exposure process, measuring alignment marks provided at the predetermined portions of shots sampled from each of the regions, detecting overlay data by separately collecting data obtained from each of the regions, calculating overlay correcting values of each of the regions based on the overlay data, and feeding back the calculated overlay correcting values to an exposure device.

To achieve the fourth object of the present invention, there is provided an apparatus for measuring an overlay, the apparatus comprising a first section for inputting regions of a wafer thereinto by assigning at least two regions on the wafer, which has been passed through an exposure process, a second section for measuring an overlay degree of alignment marks provided at the predetermined portions of shots sampled from each of the regions inputted into the first section, a third section for detecting overlay data of each of the regions by separately collecting the overlay degree of each region measured by the second section, a fourth section for calculating overlay correcting values of each of the regions based on the overlay data detected by the third section, and a fifth section for feeding back the overlay correcting values calculated by the fourth section to an exposure device.

Accordingly, the overlay data are detected from each of the regions formed on the wafer and the overlay correcting values of each of the regions are calculated, respectively. Therefore, the overlay correcting values of each of the regions are reflected in the exposure device when the exposure process is performed, so the process failure generated in each region formed on the wafer can be reduced when the exposure process is performed.

BRIEF DESCRIPTION OF THE DRAWINGS

The above objects and other advantages of the present invention will become more apparent by describing in detail preferred embodiments thereof with reference to the attached drawings in which:

FIGS. 5A to 5E are schematic views showing the concept for each parameter in overlay data;

FIGS. 7A and 7B are views showing a method for assigning regions on a wafer;

FIG. 8 is a view showing an example of overlay data detected from each region;

FIG. 9 is a schematic view of an exposure device;

FIG. 11 is a view showing a region inputting section of the overlay measuring apparatus shown in FIG. 10.

DETAILED DESCRIPTION

Hereinafter, preferred embodiments of the present invention will be described in detail with reference to accompanying drawings.

Figure 1:
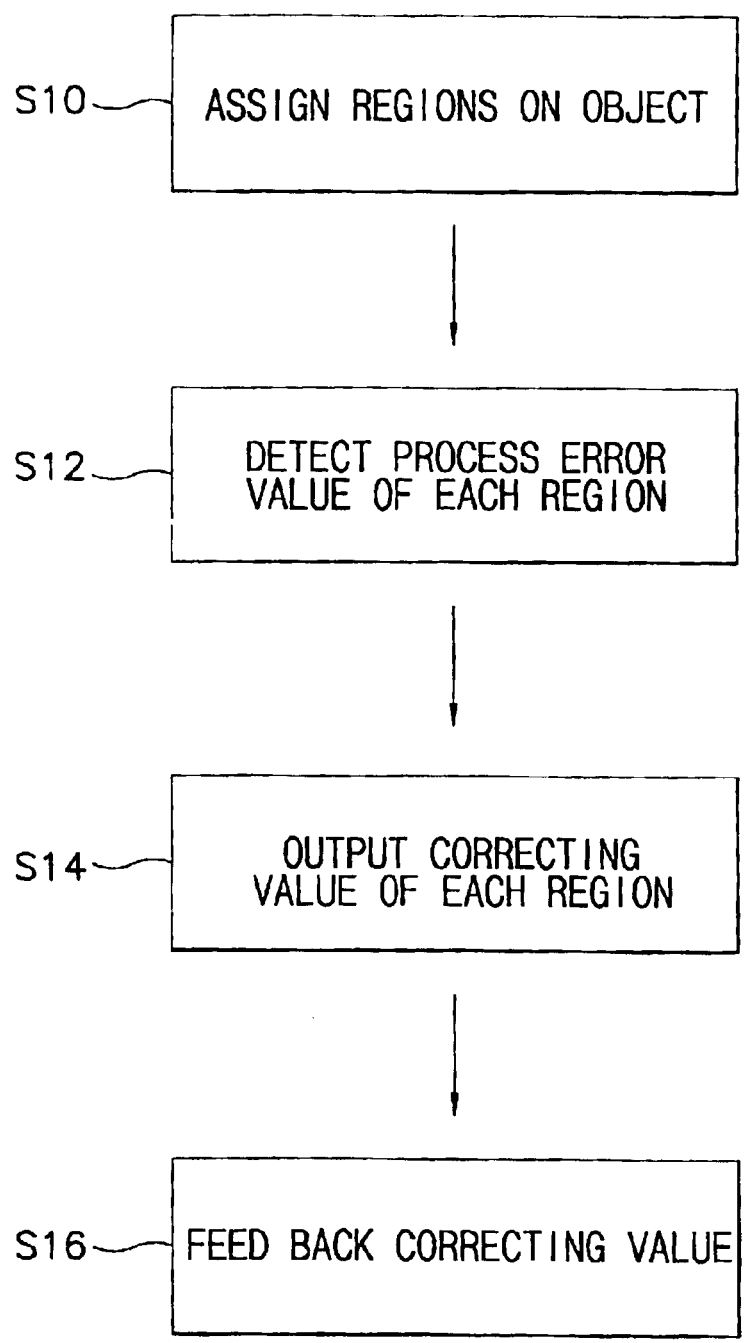
FIG. 1 is a flow chart showing one embodiment of a method for measuring process errors.

FIG. 1 is a flow chart showing one embodiment of a method for measuring process errors.

Firstly, at least two regions are assigned on an object to be measured, which has been passed through a predetermined or set unit process (step S10). The object can include a wafer. A worker can assign the regions on the object based on the error distribution of each region.

In detail, the regions are separately assigned on a center section and an edge section of the object to be measured. The reason for this is that the distribution of process errors in the center section of the object generated when performing the unit process is generally different from the distribution of process errors in the edge section of the object.

In addition, the regions can be separately assigned on a first section of the object, which is positioned within a predetermined deviation range in a normal distribution of an error distribution map sampled from history data when performing a previous unit process, and a second section of the object, which is positioned outside of the predetermined deviation range.

Then, process error values are detected from each assigned region (step S12). At this time, the process error values of each region are merged and outputted as one file. That is, only one file is managed corresponding to one object to be measured.

In order to detect the process error values, plural portions to be measured are first sampled from each region of the object. Then, error data are measured at the sampled plural portions. Thereafter, process error values in each region are calculated based on the measured error data. Beneficially, the plural portions sampled from each region are evenly distributed over the whole area of the object to be measured. That is, the plural portions sampled from each region per unit area are not extremely concentrated in a predetermined area of the object.

Then, error correcting values of each region are calculated based on the detected process error values (step S14).

It is possible to further detect a process error value corresponding to the whole area of the object to be measured by appropriately weighting the process error values obtained from each region so as to further calculate a correcting value corresponding to the whole area of the object.

The calculated correcting values are fed back to the device that performs the preceding set unit process (step S16). The correcting values of each region are applied to the device so that the device can perform the set unit process with respect to an object to be measured based on the corrected condition of each region.

Figure 2:
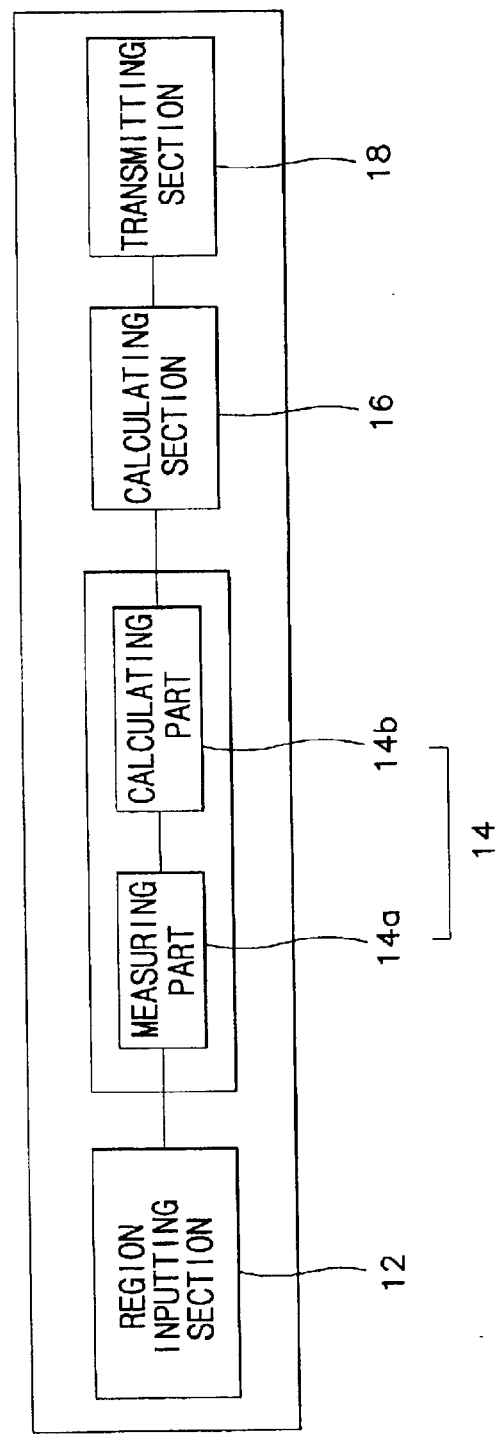
FIG. 2 is a block diagram showing one embodiment of an apparatus for measuring process errors.

FIG. 2 is a block view showing one embodiment of an apparatus for measuring process errors.

The apparatus has a region inputting section 12 for inputting regions of the object thereinto by assigning at least two regions on the object to be measured, which has been passed through the predetermined unit process.

A detecting section 14 is provided to detect the process error values from each region inputted into the region inputting section 12. The detecting section 14 detects process error values from each region, and outputs the process error values as one file by merging the process error values. Accordingly, the process values corresponding to one object to be measured are managed as one file.

The detecting section 14 includes a measuring part 14a, which samples plural portions from each region of the object and measures error data at the sampled plural portions, and a calculating part 14b for calculating the process error values of each region by receiving the error data from the measuring part 14a. The calculating part 14b further calculates a process error value corresponding to the whole area of the object by appropriately weighting the calculated process error values of each region.

A calculating section 16 is provided to calculate the correcting values of each region based on the process error values detected by the detecting section 14. The calculating section 16 further calculates a correcting value corresponding to the whole area of the object by receiving the process error value corresponding to the whole area of the object.

A data transmitting section 18 is provided to feed back the calculated correcting values to the device performing the predetermined unit process.

Therefore, the process error values of each region on the object can be detected and the error correcting values thereof can be calculated, respectively, by using the above method and apparatus. The error correcting values of each region are reflected in the device performing the unit process, so the process failure generated in each region of the object can be reduced when the unit process is performed.

Beneficially, the method and apparatus for measuring the process errors are adopted when measuring an overlay in a photo process of a semiconductor manufacturing process. Hereinafter, a method and an apparatus for measuring the overlay will be described in detail.

Figure 3:
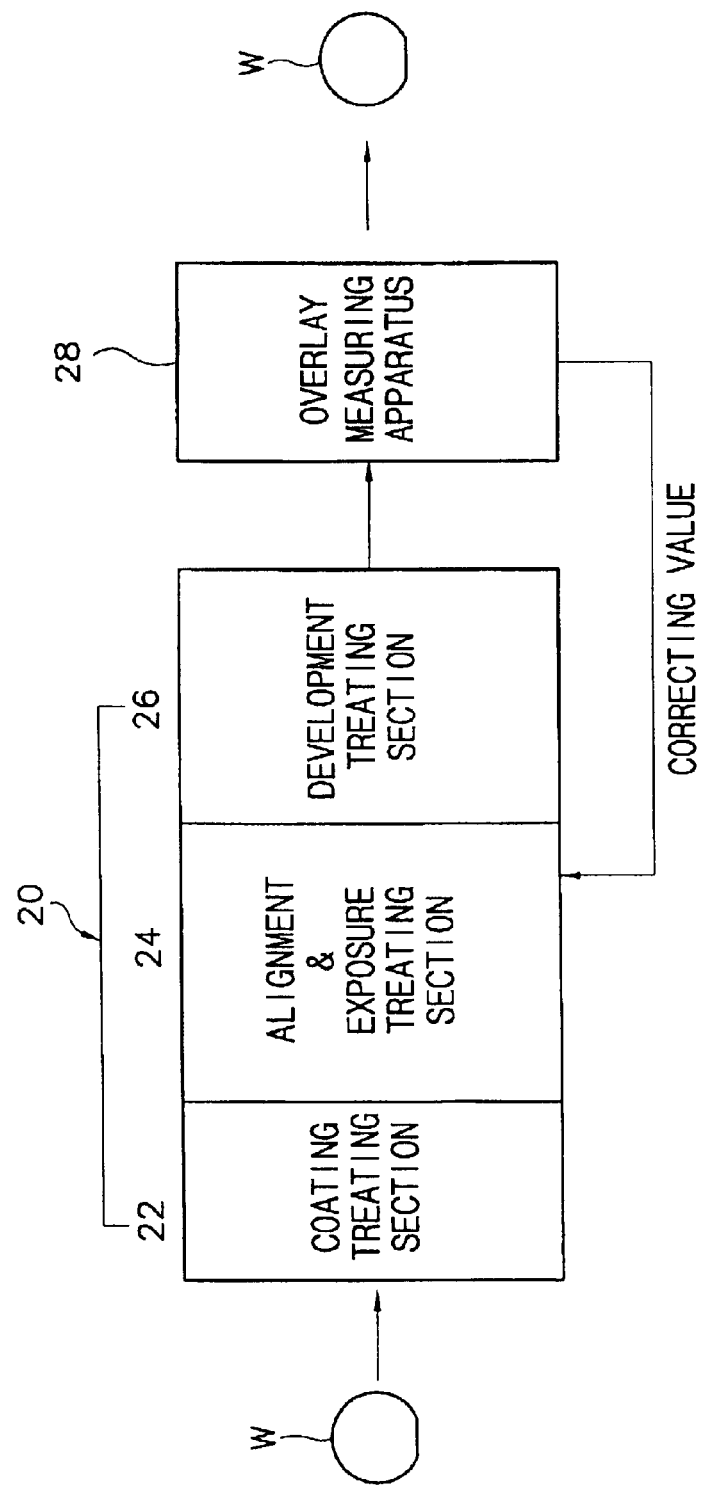
FIG. 3 is a block diagram showing an apparatus for performing a photo process.

FIG. 3 is a block view showing an apparatus for performing the photo process in semiconductor manufacturing process.

A photo apparatus 20 includes a coating treating section 22, an alignment and exposure treating section 24, and a development treating section 26.

The photo apparatus 20 coats a photoresist film on a wafer W and forms a photoresist pattern by exposing a predetermined portion of the photoresist film. The photoresist pattern formed by the photo apparatus 20 is used as an etch mask so as to form pattern layers used in a semiconductor device.

Therefore, the photo process is a main process affecting a great influence on the productivity of the semiconductor device in the semiconductor manufacturing process.

The photo process is mainly divided into a coating process, an alignment and exposure process and a development process.

In the coating treating section 22 the following processes are performed: a prebaking process for removing water from a surface of the wafer so as to increase an adhesive force between the photoresist to be coated and the surface of the wafer; a scrubbing process for removing impurities from the surface of the wafer by using high-pressurized deionized water and a brush; a spinning process for uniformly coating the photoresist; and a soft-baking process for volatilizing solvent and curing the photoresist.

In the alignment and exposure treating section 24 the following processes are performed: a pre-aligning process for aligning the wafer and a reticle after aligning the reticle by means of a reference mark of a stepper; an aligning process for fixing a flat zone of the wafer; and an exposure process for exposing the photoresist by determining an exposure degree thereof.

In the development treating section 26 the following processes are performed: a post-exposure process for removing a standing wave effect; a development process for selectively removing a portion reacting with UV light; and a hard-baking process for curing the photoresist pattern such that the photoresist pattern remaining on the wafer can sufficiently endure a thermal environment.

An overlay measuring apparatus 28 measures an overlay degree between the photoresist pattern formed on the wafer W by means of the photo apparatus 20 and a pattern layer formed therebelow. The overlay measuring apparatus 28 detects overlay data based on the measured overlay degree and feeds back the correcting value calculated based on the overlay data to the exposure apparatus. The overlay measuring process is intended to check whether or not the photoresist pattern is formed on a precise position on the wafer W, which is inevitably necessary for preventing a photo misalignment failure.

However, it is impossible to measure the overlay degree of patterns by comparing all patterns formed on a cell area with each other. For this reason, the overlay data are detected by checking the overlay degree of alignment marks after forming the alignment marks in a scribe region formed on the wafer W. The overlay measuring apparatus according to one embodiment assigns at least two regions on the wafer, which are subject to the exposure process, and detects the overlay data based on the overlay degree of the alignment marks measured in each region.

Figure 4:
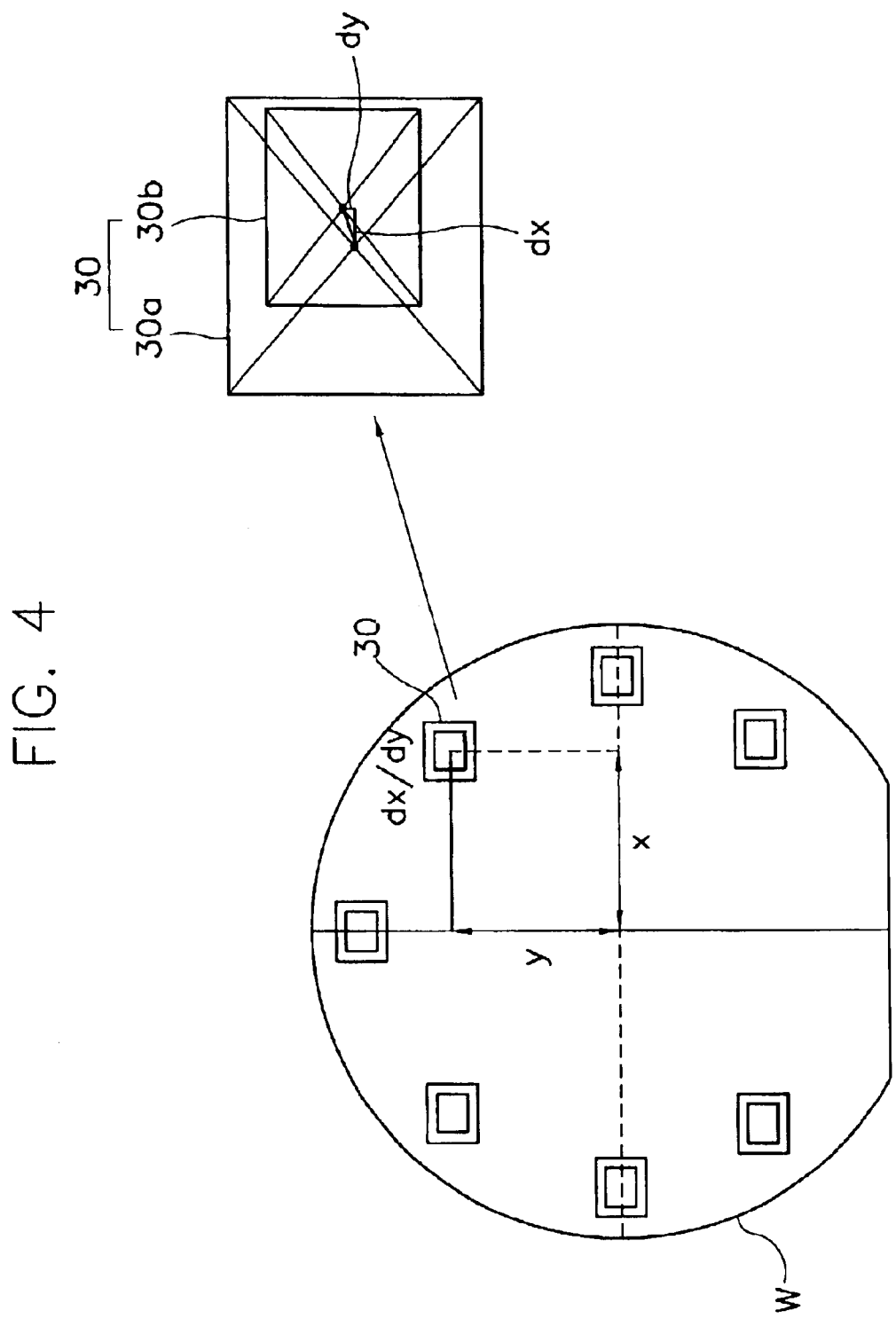
FIG. 4 is a view for explaining overlay data.

Hereinafter, the overlay data will be described with reference to FIG. 4.

In order to detect the overlay data, distances (x and y) defined in x and y axis directions between an assigned position of the wafer (for example, a center of the wafer) and a center of each alignment mark 30, and distances (dx and dy) defined in x and y axis directions between a center of each outer mark 30a formed at a lower pattern and a center of each inner mark 30b formed at an upper pattern layer are measured. Then, the distance data are analyzed by using a regression analysis method, thereby obtaining the overlay data.

The overlay data are divided into wafer-related parameters and reticle-related parameters. The wafer-related parameters represent a tilt degree of the wafer alignment and the reticle-related parameters represent a tilt degree of the reticle alignment.

Figure 5A:
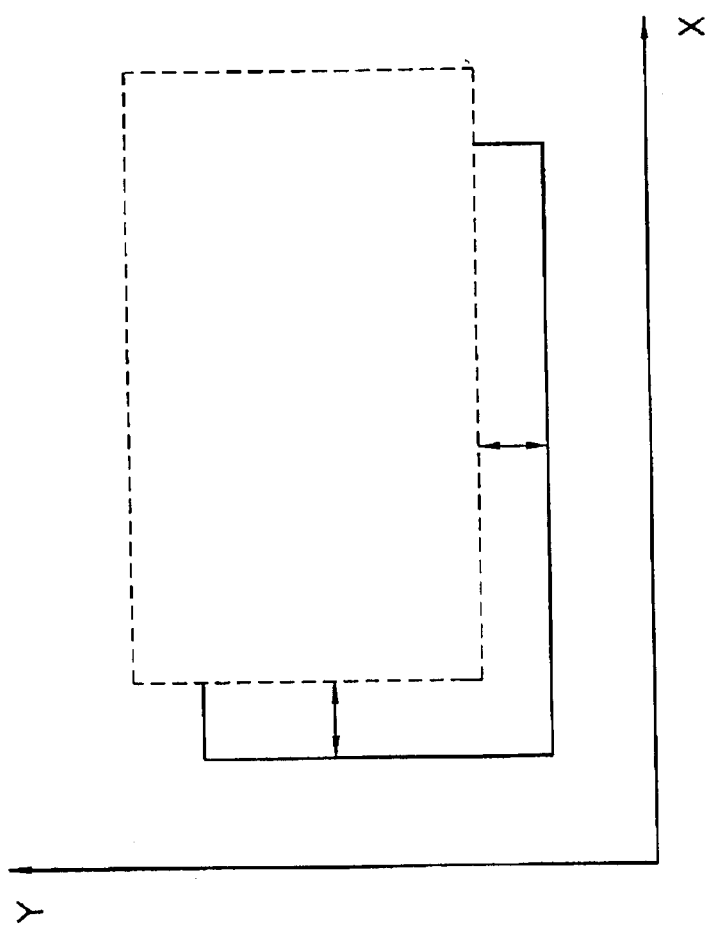
Figure 5C:
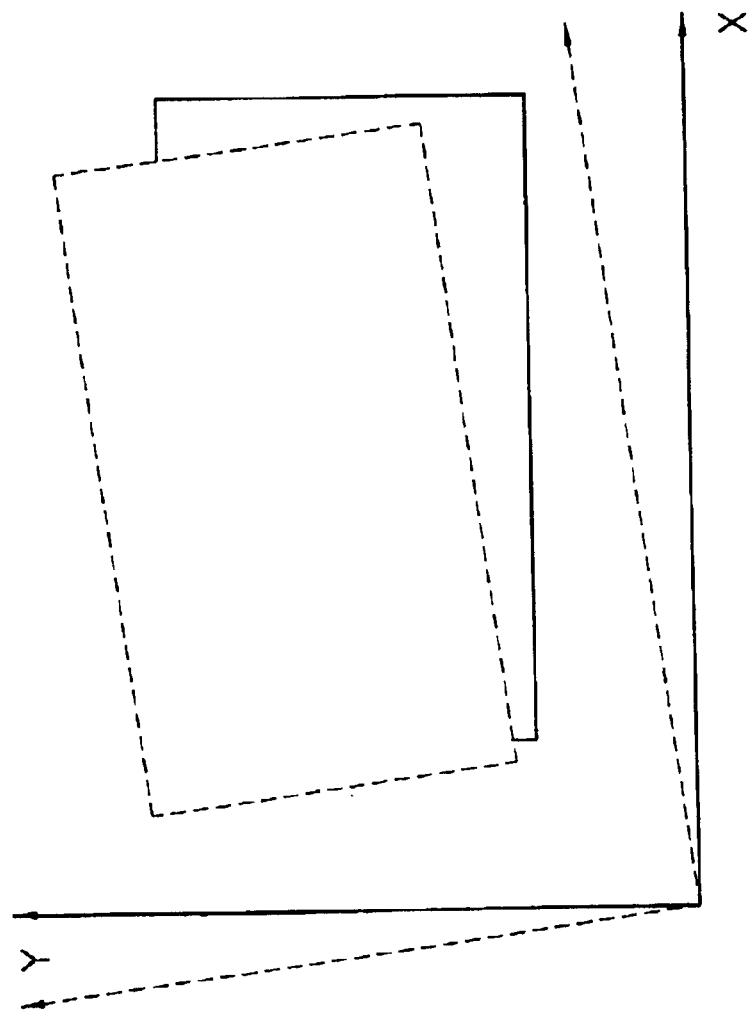
Figure 5E:
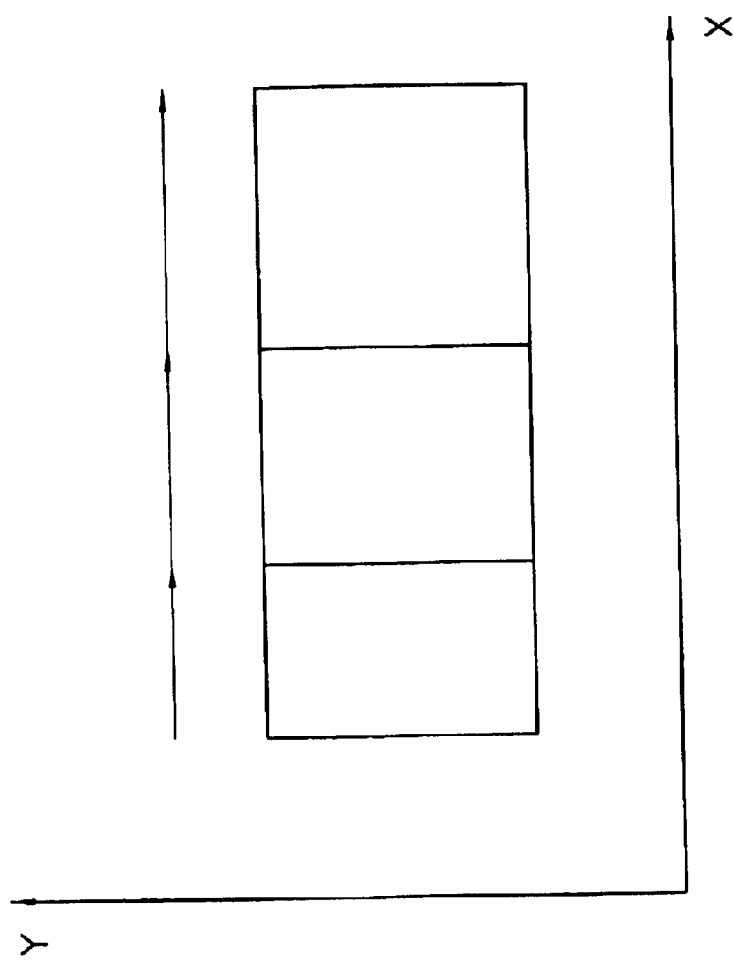

FIGS. 5A to 5C show the concept for the wafer-related parameters, and FIGS. 5D and 5E show the concept for the reticle-related parameters.

Wafer-related parameters include: Offset; offset degree of an alignment pattern in left, right, upward, and downward directions (FIG. 5A); scaling; enlarged degree of a pattern formed on a wafer in left, right, upward, and downward directions by a lens (FIG. 5B); and rotation; tilt degree of an axis of an alignment pattern with respect to a reference alignment axis; orthogonality; tilt degree between wafer alignment axes (FIG. 5C).

Reticle-related parameters include: Reticle rotation; tilt degree of an axis of an alignment pattern with respect to a reference alignment axis due to an imprecise setting of the reticle (FIG. 5D); and reticle reduction; enlarged degree of a pattern formed on a wafer in left, right, upward, and downward directions due to an imprecise setting of the reticle (FIG. 5E).

Figure 6:
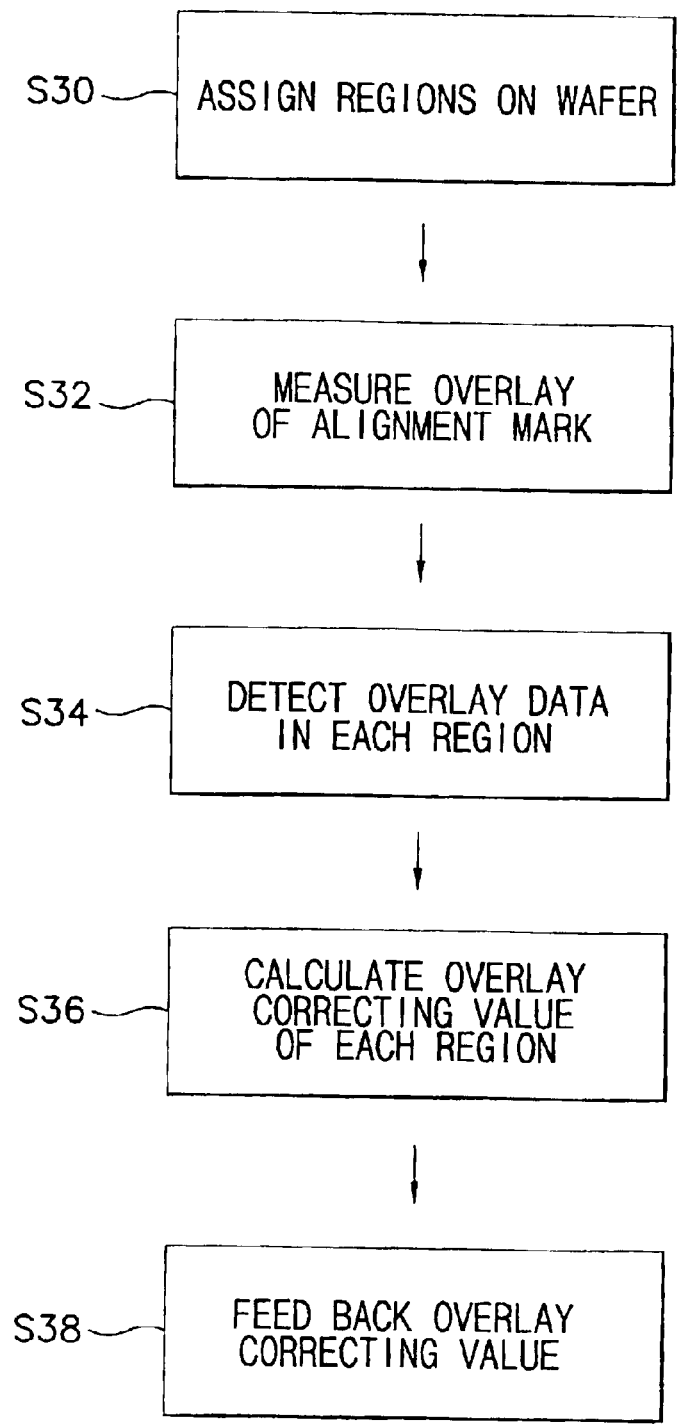
FIG. 6 is a flow chart for explaining one embodiment of a method for measuring process errors.

Hereinafter, one embodiment of a method for measuring the overlay will be described with reference to FIG. 6.

At least two regions are assigned on the wafer, which has been passed through the exposure process (step S30).

Referring to FIG. 7A, the regions are assigned on the basis of a step pitch of a shot used in the exposure process. The shot means one exposure, and the step pitch means the size in X and Y direction of each shot.

When performing the photo process on the wafer formed with predetermined films, the step pitches of shots to be used are identical to each other. However, since the wafer has a disc shape, if shots having a rectangular shape are applied to the wafer, the shots formed at an edge of the wafer have a half-sized step pitch. Accordingly, on the basis of the size of the step pitch, the regions to be assigned on the wafer can be divided into a first region A having a normal-sized step pitch and a second region B having the half-sized step pitch.

Referring to FIG. 7B, the regions are separately assigned on a center section "A" and an edge section B of the wafer. The degree of misalignment in the center section "A" of the wafer is different from the misalignment degree in the edge section "B" of the wafer even when the exposure process is carried out under the same conditions. Generally, a misalignment failure is more frequently generated in the edge section "B" of the wafer as compared with the center section "A" of the wafer. For this reason, the regions are separately assigned on the center section "A" and an edge section "B" of the wafer.

Though not illustrated in the figures, it is also possible to separately assign the regions on a first section of the wafer, which is positioned within a predetermined deviation range in a normal distribution of an error distribution map of overlay data sampled from history data obtained by measuring the overlay when performing the previous photo process, and a second section of the wafer, which is positioned outside of the predetermined deviation range.

Besides, at least two regions can be assigned on the wafer by considering the size of the step pitch, the center section and edge section of the wafer, as well as the error distribution degree of the overlay data.

After sampling shots to be measured from each assigned region, the overlay degree of alignment marks provided in the sampled shots is measured, respectively, (step S32).

It takes a long time to measure the overlay degree with respect to all alignment marks formed in the wafer, so 30 to 40% of alignment marks are sampled for measuring the overlay degree thereof. Beneficially, the sampled alignment marks are evenly distributed over the whole area of the wafer. That is, the shots sampled from each region per unit area are not extremely concentrated in a predetermined area of the wafer. The overlay degree of the alignment marks means measuring values of distances (x and y) defined in x and y axis directions between an assigned position of the wafer (for example, a center of the wafer) and a center of each alignment mark, and measuring values of distances (dx and dy) defined in x and y axis directions between a center of each outer mark formed at a lower pattern and a center of each inner mark formed at an upper pattern layer. If there is a region formed with shots having half-sized step pitches, the overlay degree is measured based on the half-sized step pitches.

The overlay degrees measured from the alignment marks in each region are separately collected so as to respectively detect the overlay data in each region (step S34).

The overlay data are above-mentioned wafer-related parameters and reticle-related parameters.

The wafer-related parameters can be obtained by analyzing values of Xoff, Xsca, Xrot, Yoff, Ysca and Yrot, which satisfy equations described below, through a regression analysis method based on the values of x, y, dx, and dy measured at each region. The values of Xoff, Xsca, Xrot, Yoff, Ysca and Yrot represent X-direction offset, X-direction scaling, X-direction rotation, Y-direction offset, Y-direction scaling, and Y-direction rotation, respectively, which are wafer-related parameters.

$$dx=Xoff+Xsca*x-Xrot*y$$

$$dy=Yoff+Ysca*y-Yrot*x$$

The reticle-related parameters can be obtained by analyzing values of Xred, Xrot, Yred, and Yrot, which satisfy equations described below, through the regression analysis method. The values of Xred, Xrot, Yred, and Yrot represent X-direction reduction, X-direction rotation, Y-direction reduction, and Y-direction rotation, respectively, which are reticle-related parameters.

$$dx=Xoff+Xred*x-Xrot*y$$

$$dy=Yoff+Yred*y-Yrot*x$$

The values of x and y substituted for calculating the reticle-related parameters mean distances in the x and y axis directions from an alignment mark provided at a center of the shot, to other alignment marks among plural alignment marks included in one shot.

Beneficially, since the overlay data measured from the alignment marks in each region are separately collected to detect the overlay data in each region, the number of overlay data to be detected is identical to the number of regions assigned on the wafer as shown in FIG. 8. In addition, even when the shots formed in one region have step pitches different from the step pitches of shots formed in the other region, the above equations are applied, so that the overlay data can be detected. Therefore, instead of detecting only one overlay datum from one wafer, the overlay data can be detected from each region of the wafer.

It is possible to further detect the overlay data corresponding to the whole area of the wafer by applying a weight to the overlay data detected from each region. The weight can be applied to each of overlay data, for example, based on the number of alignment marks sampled from each region. In detail, the overlay data corresponding to the whole area of the wafer are obtained by calculating parameters of the wafer and reticle, setting the whole overlay data as 100% and allotting the weight to the overlay data of each region corresponding to the percentage thereof with respect to the whole overlay data. For example, when the regions are aligned on the wafer based on the size of the step pitch, 90% of the total weight is allotted to one region formed with shots having normal step pitches, and 10% of the total weight is allotted to the other region formed with shots having the half-sized step pitches, thereby detecting the overlay data corresponding to whole area of the wafer.

The overlay data of each region assigned on a wafer and the overlay data corresponding to the whole area of the wafer are merged and outputted as one file. Accordingly, the overlay data are managed as one file.

Then, the overlay correcting values are calculated based on the overlay data detected from each region (step S36). In addition, the overlay correcting values are calculated based on the overlay data corresponding to the whole area of the wafer. The overlay correcting values are calculated according to a predetermined algorithm with the overlay data input thereto. Therefore, it is possible to obtain the optimum overlay correcting values corresponding to each region based on the overlay data detected from each region.

The calculated correcting values of each region are fed back to the alignment and exposure treating section (step S38).

As shown in FIG. 9, the exposure treating section 40 includes a wafer stage 42, a lens system 44, a reticle 46 and a light source system (not shown). When the light generated from the light source system radiates onto the wafer W through a mask pattern of the reticle 46 and the lens system 44, the mask pattern of the reticle 46 is projected on the wafer W in a reduced size.

Accordingly, it is required to correct the X and Y-axis offset, rotation, and orthogonality of the wafer W placed on the wafer stage 42 and to correct the tilt of the phase projected on the wafer in the left and light directions. In addition, it is required to correct the reticle rotation and reticle reduction.

Such correction is carried out based on the error correction values of each region fed back to the exposure treating section. That is, the alignment of the wafer W and reticle 46 are variously corrected corresponding to the error correction values of each region of the wafer W, so the subsequent exposure process is carried out with respect to the wafer having the corrected alignment.

Figure 10:
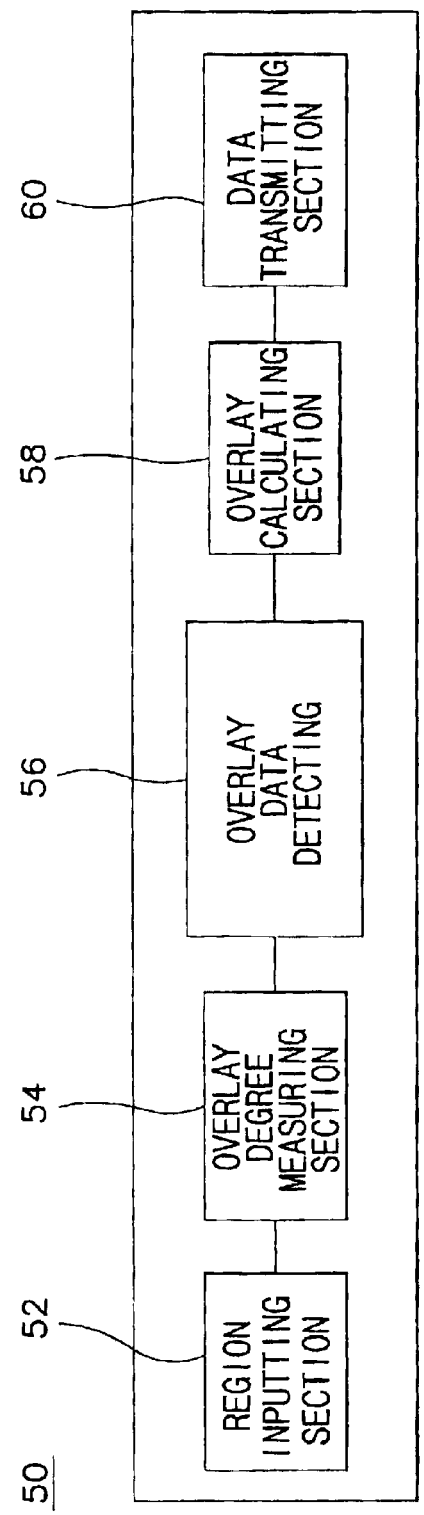
FIG. 10 is a block diagram showing one embodiment of an apparatus for measuring an overlay.

FIG. 10 is a block diagram showing one embodiment of an apparatus for measuring the overlay.

The overlay measuring apparatus has a region inputting section 52 for inputting regions of the wafer thereinto by assigning at least two regions on the wafer, which has been passed through the exposure process. As shown in FIG. 11, the regions assigned on the wafer and the step pitch in each region are inputted into the region inputting section 52.

An overlay measuring section 54 is provided to measure an overlay degree of alignment marks provided at predetermined portions of shots sampled from each region inputted into the region inputting section 52.

An overlay data detecting section 56 is provided to detect the overlay data of each region by separately collecting the overlay degree of each region measured by the overlay measuring section 54. The overlay data detecting section 56 outputs the overlay data with respect to at least one step pitch. In addition, the overlay data detecting section 56 outputs the overlay data as one file by merging the overlay data of each region. Accordingly, the overlay data corresponding to one wafer are managed in one file. The overlay detecting section 56 further detects the overlay data corresponding to the whole area of the wafer by applying a weight to the overlay data of each region.

An overlay calculating section 58 is provided to calculate overlay correcting value of each region based on the overlay data detected by the overlay data detecting section 56. The overlay calculating section 58 further calculates the overlay correcting value corresponding to the whole area of the wafer by receiving the overlay correcting value corresponding to the whole area of the wafer.

In addition, a data transmitting section 60 is provided to feed back the overlay correcting values calculated by the overlay calculating section 58 to the exposure device.

Accordingly, it is possible to detect the overlay data of each region and calculate the overlay correcting values of each region based on the overlay data by using the above-mentioned apparatus and method. The overlay correcting values of each region are reflected to the exposure device when performing the exposure process, so the process failures generated in each region of the wafer can be reduced.

As described above, according to the present invention, the overlay correcting values of each region can be calculated by detecting the process error values of each region of the object to be measured. The overlay correcting values of each region of the object are fed back to the exposure device when performing the exposure process, so the process failure generated in each region of the object can be reduced.

While the present invention has been described in detail with reference to the preferred embodiment thereof, it should be understood to those skilled in the art that various changes, substitutions and alterations can be made hereto without departing from the scope of the invention as defined by the appended claims.

What is claimed is:

1. A method for measuring process errors, the method comprising:

i) assigning at least two regions on an object to be measured that has been passed through a set unit process;

ii) detecting process error values from each of the regions, wherein the process error values are detected by measuring error data of plural sections that are sampled from each of the regions assigned on the object, and calculating the process error values of each of the regions based on the measured error data;

iii) calculating error correcting values of each of the regions based on the process error values; and iv) feeding back the calculated error correcting values to a unit process device for performing the set unit process.

2. The method as claimed in claim 1, wherein the process error values detected from each of the regions are merged and outputted as one file.

3. The method as claimed in claim 1, wherein the plural sections sampled from each region are uniformly distributed through a whole area of the object to be measured.

4. The method as claimed in claim 1, wherein the regions are separately assigned on a center section and an edge section of the object.

5. The method as claimed in claim 1, wherein the regions are separately assigned on a first section of the object which is positioned within a predetermined deviation range in a normal distribution of an error distribution map sampled from former history data, and a second section of the object which is positioned outside of the predetermined deviation range.

6. The method as claimed in claim 1, further comprising detecting a process error value corresponding to a whole area of the object to be measured by applying weighting factors to the process error values obtained from each of the regions.

7. The method as claimed in claim 6, further comprising calculating a correcting value corresponding to a whole area of the object to be measured based on the process error value corresponding to the whole area of the object to be measured.

8. The method as claimed in claim 1, wherein the error correcting values of each of the regions fed back to the unit process device are applied to the unit process device.

9. The method as claimed in claim 1, wherein the unit process includes an exposure process, and the process error value includes overlay data.

10. The method as claimed in claim 9, wherein the regions are assigned on a wafer that has been passed through the exposure process, based on a size of a step pitch of each shot.

11. A method for measuring an overlay, the method comprising:

i) assigning at least two regions on a wafer that has been passed through an exposure process, wherein the regions are assigned on the wafer based on a size of a step pitch of each shot;

ii) measuring alignment marks provided at predetermined portions of shots sampled from each of the regions;

iii) detecting overlay data by separately collecting data obtained from each of the regions;

iv) calculating overlay correcting values of each of the regions based on the overlay data; and v) feeding back the calculated overlay correcting values to an exposure device.

12. The method as claimed in claim 11, wherein the overlay data are merged and outputted as one file.

13. The method as claimed in claim 11, wherein the regions are separately assigned on a first section of the wafer which is positioned within a predetermined deviation range in a normal distribution of an error distribution map sampled from former history data, and a second section of the wafer which is positioned outside of the predetermined deviation range.

14. The method as claimed in claim 11, further comprising detecting whole overlay data corresponding to the wafer by applying weighting factors to the overlay data obtained from each of the regions.

15. The method as claimed in claim 11, further comprising calculating an overlay correcting value based on the whole overlay data.

16. An apparatus for measuring process errors, the apparatus comprising:

a first means for inputting regions of an object thereinto by assigning at least two regions on the object to be measured, which has been passed through a set unit process;

a second means for detecting process error values from each region inputted into the first means, wherein the second means comprises, a measuring section for measuring error data at plural portions sampled from each of the regions formed on the object, and a calculating section for calculating the process error values of each region by receiving the error data from the measuring section;

a third means for calculating correcting values of each region based on process error values detected by the second means; and a fourth means for feeding back the calculated correcting values to a device performing the predetermined unit process.

17. The apparatus as claimed in claim 16, wherein the second means outputs the process error values as one file by merging the process error values.

18. The apparatus as claimed in claim 16, wherein the calculating section further calculates a process error value corresponding to a whole area of the object by applying weighting factors to the process error values of each of the regions.

19. The apparatus as claimed in claim 18, wherein the second means calculates a correcting value corresponding to the whole area of the object by receiving the process error value corresponding to the whole area of the object calculated by the calculating section.

20. The apparatus as claimed in claim 18, wherein the unit process includes an exposure process and the process error value detected by the second means includes overlay data.

21. The apparatus as claimed in claim 20, wherein the second means detects the overlay data with respect to at least one step pitch.

22. An apparatus for measuring an overlay, the apparatus comprising:

a first means for inputting regions of a wafer thereinto by assigning at least two regions on the wafer, which has been passed through an exposure process, wherein the regions are assigned on the wafer based on a size of a step pitch of each shot;

a second means for measuring an overlay degree of alignment marks provided at set portions of shots sampled from each region inputted into the first means;

a third means for detecting overlay data of each of the regions by separately collecting the overlay degree of each region measured by the second means, wherein the third means outputs the overlay data with respect to at least one step pitch;

a fourth means for calculating overlay correcting values of each of the regions based on the overlay data detected by the third means; and a fifth means for feeding back the overlay correcting values calculated by the fourth means to an exposure device.

23. The apparatus as claimed in claim 22, wherein the third means outputs the overlay data as one file by merging the overlay data.

* * * * *